(12) United States Patent
Mast et al.

(10) Patent No.: US 6,281,835 B1
(45) Date of Patent: Aug. 28, 2001

(54) RADAR TRANSMITTER

(75) Inventors: Ingen Adri Mast, KW Hengelo; Koenraad Wieringa, EC Hengelo, both of (NL)

(73) Assignee: Thales Nederland B.V., GD Hengelo (NL)

( * ) Notice: Subject to any disclaimer, the term of this patent is extended or adjusted under 35 U.S.C. 154(b) by 0 days.

(21) Appl. No.: 09/485,720

(22) PCT Filed: Aug. 18, 1998

(86) PCT No.: PCT/EP98/05280
§ 371 Date: Mar. 2, 2000
§ 102(e) Date: Mar. 2, 2000

(87) PCT Pub. No.: WO99/12256
PCT Pub. Date: Mar. 11, 1999

(30) Foreign Application Priority Data

Sep. 3, 1997 (NL) .................................................. 1006924

(51) Int. Cl.$^7$ ............................................. G01S 7/282
(52) U.S. Cl. .................... 342/175; 342/202; 342/203
(58) Field of Search ........................................ 342/175, 200, 342/201, 202, 203, 204, 368, 371, 372, 374, 377

(56) References Cited

U.S. PATENT DOCUMENTS

| | | | |
|---|---|---|---|
| 4,064,464 | * 12/1977 | Morse | 330/53 |
| 5,136,300 | * 8/1992 | Clarke et al. | 342/175 |
| 5,325,099 | * 6/1994 | Nemit et al. | 342/202 |
| 5,561,397 | * 10/1996 | Kumar et al. | 330/295 |
| 5,781,066 | * 7/1998 | Parisi et al. | 330/2 |

* cited by examiner

Primary Examiner—John B. Sotomayor
(74) Attorney, Agent, or Firm—Oblon, Spivak, McClelland, Maier & Neustadt, P.C.

(57) ABSTRACT

The invention relates to solid-state radar transmitter, comprising a number of amplifier modules (4.i). To prevent the trailing edge of a steer pulse supplied to the radar transmitter from becoming too steep when passing the amplifier modules (4.i) driven in saturation, the supply voltage on at least One amplifier state in each amplifier module (4.i) is switched off just before the end of the steer pulse.

10 Claims, 3 Drawing Sheets

RADAR TRANSMITTER

Figure 1:
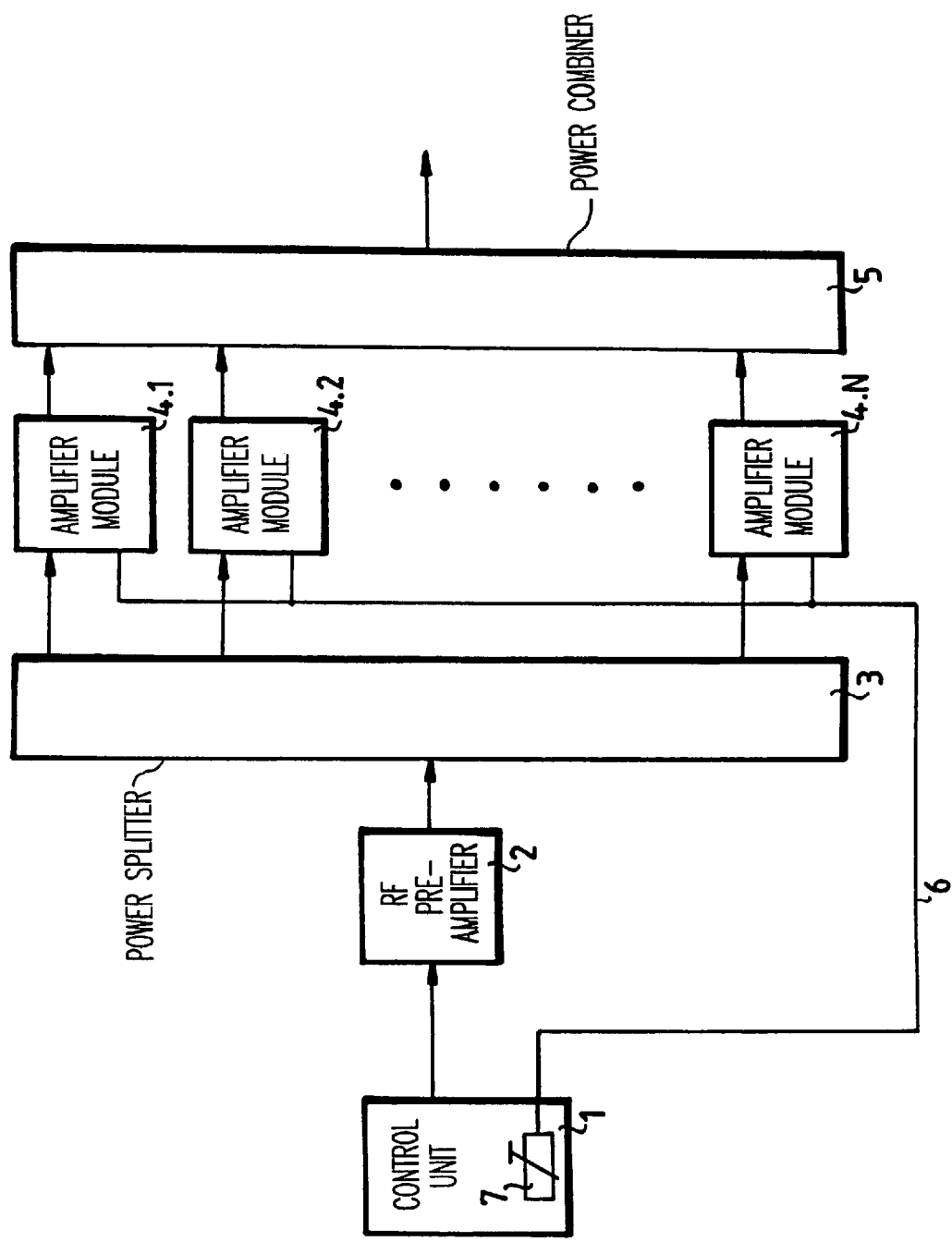

The invention relates to a modular solid-state radar transmitter, comprising a control unit for the supply of RF steer pulses and logical control signals, a preamplifier, a power splitter for splitting the preamplified steer pulses into N RF input signals, N solid-state amplifier modules and a power combiner for combining the output signals of the amplifier modules authorized by the control signals.

A modular solid-state transmitter of this type is known from patent specification EP-A-0.622.638. In this known transmitter, individual solid-state amplifier modules are, in a manner predefined, switched on and subsequently switched off by means of the logical control signals for generating a transmitter pulse with a desired amplitude modulation.

In the solid-state transmitter according to the invention, the logical control signals are used for enabling all amplifier modules at least substantially simultaneously such that an RF steer pulse can be amplified to yield a transmitter pulse. It however appears that a tapering of the RF steer pulse, applied to restrict the frequency spectrum of the transmitter pulse, is hardly noticeable in the transmitter pulse. The present invention has for its object to restrict the frequency spectrum of the transmitter pulse in an alternative manner by controlling the gain of all amplifier modules with only one control signal and is characterized in that one additional logical control signal is provided that controls all N amplifier modules and that switches during the occurrence of RF steer pulses.

An advantageous embodiment of the invention which can be easily implemented from a hardware point of view is characterized in that an amplifier module comprises a single first amplifier stage to which the additional control signal is connected. In this embodiment, the first amplifier stage is preferably an RF transistor in a grounded base circuit where a collector is connected to a supply voltage.

A very advantageous embodiment of the invention is characterized in that the collector can be connected to the supply voltage through a first switching element and to earth potential through a second switching element and that the additional control signal controls both switching elements at least substantially simultaneously such that the collector is connected to earth potential before the RF steer pulse has ended.

A further advantageous embodiment of the invention in which a tapering of the transmitter pulse is at least substantially independent of a tapering of the additional control signal is characterized in that the collector is furthermore connected to a capacitor, whose capacity value is selected to be such that, in combination with an internal impedance of the switching elements, the supply voltage on the collector has a decay time of 0.1–1 microsecond.

In view of the constant endeavour to take optimal advantage of the entire RF steer pulse, another advantageous embodiment of the invention is characterized in that means are provided for adjusting a time delay for the additional logical control signal, which means may be incorporated in the control unit, preferably in a central position.

An alternative advantageous embodiment of the invention which is also quite simple to implement, is based on a deliberately introduced statistical spread on the switching off of the individual amplifier modules. This embodiment is characterized in that the additional logical control signal is provided with means for adjusting a time delay and that these means are incorporated in at least substantially each amplifier module. A tapering of the transmitter pulse can then simply be obtained by adjusting the amplifier modules with a 0.1–1 microsecond spread on the time delays.

Figure 2:
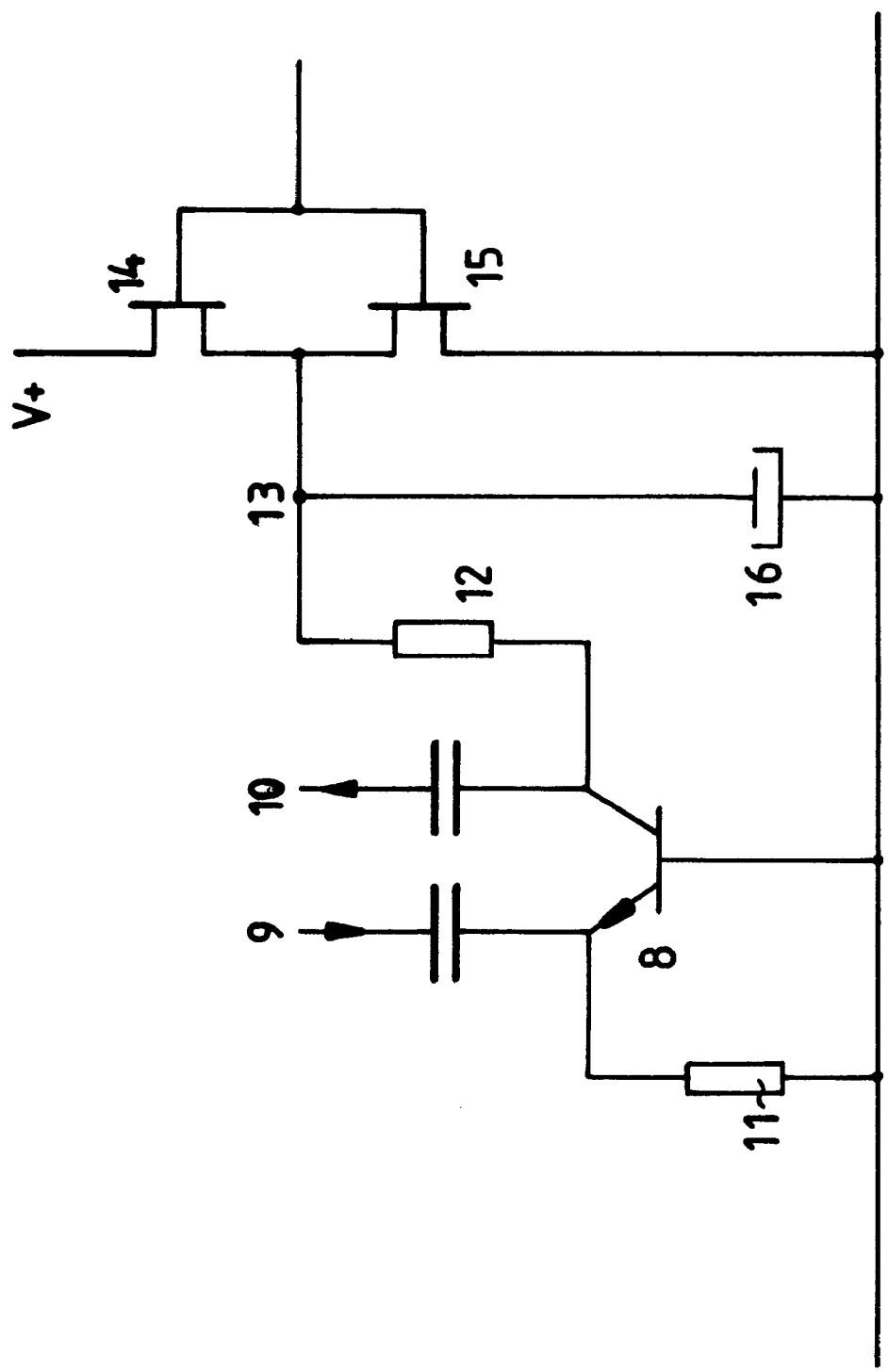
Figure 3:
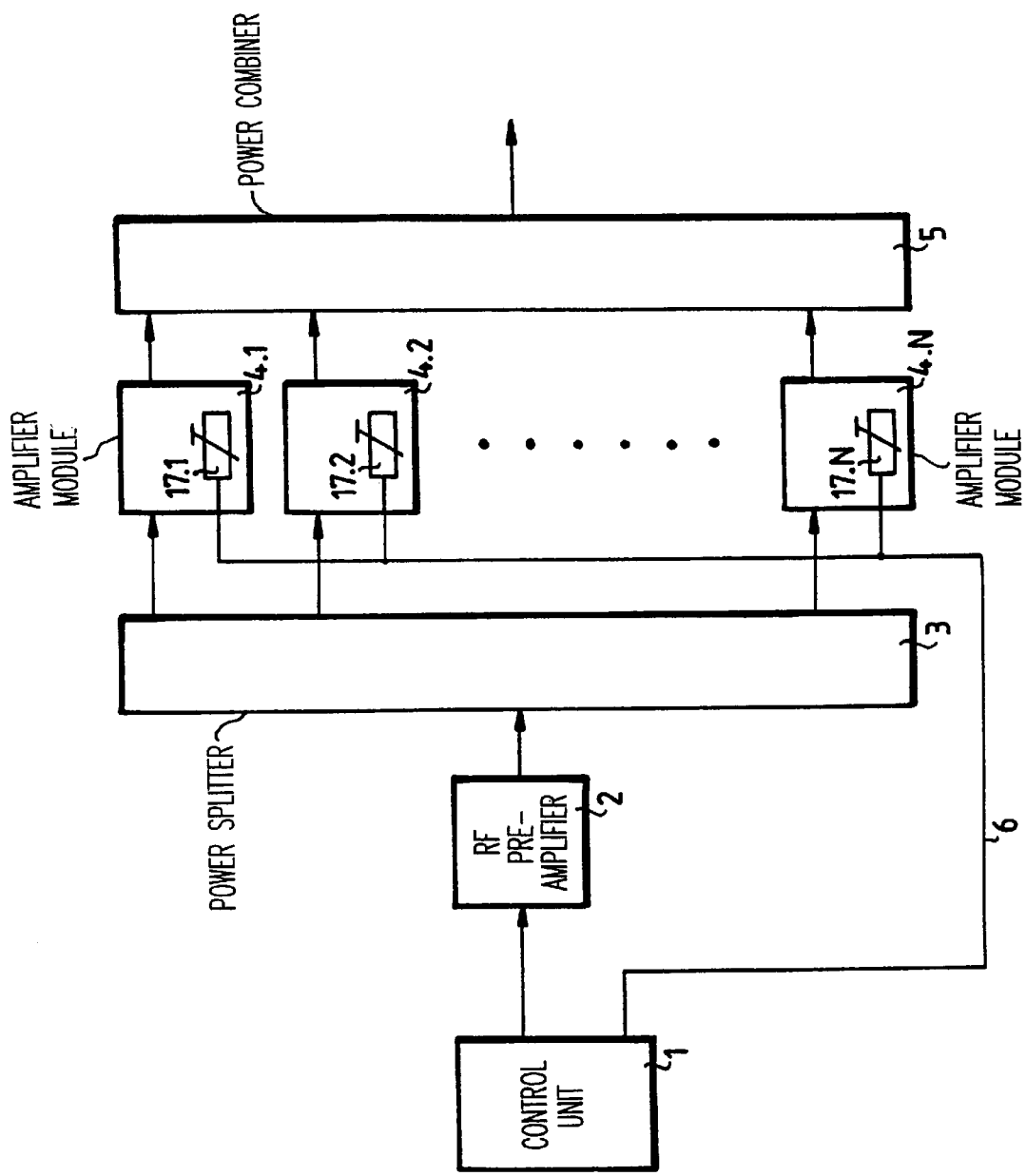

The invention will now be described in greater detail with reference to the following figures, of which:

FIG. 1 schematically represents a first embodiment of the modular solid-state transmitter according to the invention;

FIG. 2 schematically represents an amplifier stage with a switched collector according to the invention;

FIG. 3 schematically represents a second embodiment of the modular solid-state transmitter according to the invention.

FIG. 1 schematically represents a first embodiment of the modular solid-state transmitter according to the invention, incorporating a control unit 1 which supplies RF steer pulses to an RF preamplifier 2, whereupon the preamplified RF steer pulses are supplied to a power splitter 3 which, at its N outputs, delivers N identical RF steer pulses. These pulses are passed to N identical solid-state amplifier modules 4.1, 4.2, ..., 4.N whose output signals are combined in power combiner 5 to yield a transmitter pulse. Solid-state transmitters of this type are well-known in the art. The advantage of a solid-state transmitter, when compared with, for instance, a TWT transmitter, is its sustained performance also in the event of an amplifier module breakdown.

A drawback of the known solid-state radar transmitter is that the RF steer pulses have to pass a large number of amplifier stages which are all driven into saturation. This will cause a distortion of the initial pulse form. Particularly the leading edge and/or trailing edge of the transmitter pulse may become increasingly steep, resulting in a pulse with a "blurred" frequency spectrum. This means that the frequency spectrum contains frequencies that did not occur in the original RF steer pulses. Both the leading edge and the trailing edge may rise to a considerable steepness. In actual practice this pulse steepening particularly affects the trailing edge. Consequently, the description of the invention will be confined to this phenomenon. It is understood that the invention can be easily adapted to counter situations in which the leading edge is affected as well. To prevent the trailing edge from becoming too steep, the radar transmitter is provided with an additional logical control signal 6 for reducing the gain in the preamplifier 2 or in the amplifier modules 4.i. just prior to the end of the RF steer pulses. It has been proved by experiment that a suitable trailing edge can be obtained by reducing the gain of the first amplifier stage in each amplifier module 4.i. The gain is reduced at the command of the logical control signal 6, whereby control unit 1 is preferably provided with an adjustable time delay 7 by means of which the gain can be reduced accurately near the trailing edge. Besides the logical control signal 6, more logical control signals will generally occur between control unit 1 and the amplifier modules 4.i, although these are irrelevant to the present invention.

FIG. 2 schematically shows an amplifier stage with a switched collector, where RF transistor 8 in a common base circuit receives an input signal 9 at its emitter and delivers an output signal 10 at its collector. As is usual, the emitter is connected to earth via a HF choke 11 and the collector is connected to a node 13 via a HF choke 12. By means of a complementary pair of FETs 14, 15, node 13 can be connected to a supply voltage V+ or to earth; the gates of FETs 14, 15 are controlled by the additional logical control signal, such that node 13 is, during the presence of an RF steer pulse, connected to V+ and is, just before the end of the RF steer pulse, connected to earth. By moreover connecting node 13 to a capacitor 16, the edge realized by means of FETs 14, 15 can be given a reduced steepness, which will also make for a reduced steepness of the transmitter pulse.

FIG. 3 schematically shows a second embodiment of the solid-state amplifier according to the invention where each amplifier module 4.i. incorporates an adjustable time delay 17.i. The principle of operation may be similar to that of the radar transmitter described with reference to FIG. 1 and FIG. 2, although an additional reduction of the steepness of the transmitter pulse may now be obtained by introducing a certain measure of spread among the time delays 17.i. Another possibility is to select a smaller value for capacitor 16 in FIG. 2. This entails the advantage that the phase of the RF signal in the trailing edge remains better-defined, because the various amplifier modules 4.i are switched on or off.

What is claimed is:

1. Modular solid-state radar transmitter, comprising a control unit for the supply of RF steer pulses and logical control signals, a preamplifier, a power splitter for splitting the preamplified steer pulses into N RF input signals, N solid-state amplifier modules and a power combiner for combining the output signals of the amplifier modules authorized by the control signals, characterized in that one additional logical control signal is provided that controls all N amplifier modules and that switches during the occurrence of the RF steer pulses.

2. Modular solid-state radar transmitter as claimed in claim 1, characterized in that an amplifier module comprises a single first amplifier stage to which the additional control signal is connected.

3. Modular solid-state radar transmitter as claimed in claim 2, characterized in that the first amplifier stage comprises a transistor in a common base circuit of which a collector is in the operating mode connected to a supply voltage.

4. Modular solid-state radar transmitter as claimed in claim 3, characterized in that the collector can be connected to the supply voltage through a first switching element and to earth potential through a second switching element and that the additional control signal controls both switching elements at least substantially simultaneously such that the collector is connected to earth potential before the RF steer pulse has ended.

5. Modular solid-state radar transmitter as claimed in claim 4, characterized in that the collector is furthermore connected to a capacitor.

6. Modular solid-state amplifier as claimed in claim 5, characterized in that the capacitor value is selected to be such that, in combination with an internal impedance of the switching elements, the supply voltage on the collector has a decay time of 0.1–1 microsecond.

7. Modular solid-state amplifier as claimed in claim 1, characterized in that means are provided for adjusting a time delay for the additional logical control signal.

8. Modular solid-state amplifier as claimed in claim 7, characterized in that the means are incorporated in the control unit.

9. Modular solid-state amplifier as claimed in claim 7, characterized in that the means are incorporated in at least substantially each amplifier module.

10. Modular solid-state amplifier as claimed in claim 9, characterized in that the time delays as adjusted in the amplifier modules have a 0.1–1 microsecond spread.

* * * * *